(12) United States Patent
Lee et al.

(10) Patent No.: US 8,970,817 B2
(45) Date of Patent: Mar. 3, 2015

(54) DISPLAY PANEL

(76) Inventors: Seon Uk Lee, Seongnam-si (KR); Sang Il Kim, Yongin-si (KR); Jin Bo Shim, Seoul (KR); Nak Cho Choi, Hwaseong-si (KR); Jin Woo Choi, Seoul (KR)

(*) Notice: Subject to any disclaimer, the term of this patent is extended or adjusted under 35 U.S.C. 154(b) by 217 days.

(21) Appl. No.: 13/605,669

(22) Filed: Sep. 6, 2012

(65) Prior Publication Data
US 2013/0306994 A1  Nov. 21, 2013

(30) Foreign Application Priority Data

May 21, 2012 (KR) .......................... 10-2012-0053721

(51) Int. Cl.
*G02F 1/1333* (2006.01)

(52) U.S. Cl.
USPC .......................................................... 349/158

(58) Field of Classification Search
USPC .......................................................... 349/158
See application file for complete search history.

(56) References Cited

U.S. PATENT DOCUMENTS

| | | | |
|---|---|---|---|
| 6,300,926 B1 | 10/2001 | Yoneya et al. | |
| 7,242,453 B2 | 7/2007 | Saida et al. | |
| 7,300,692 B2 | 11/2007 | Hirota et al. | |
| 7,378,137 B2* | 5/2008 | Saida et al. | 428/1.51 |
| 7,432,993 B2 | 10/2008 | Kameyama et al. | |
| 7,502,081 B2* | 3/2009 | Umemoto et al. | 349/63 |
| 7,768,613 B2* | 8/2010 | Hirota | 349/141 |
| 7,794,803 B2 | 9/2010 | Hashimoto et al. | |
| 2005/0206804 A1 | 9/2005 | Hara | |
| 2006/0209246 A1 | 9/2006 | Kim | |
| 2008/0225214 A1 | 9/2008 | Kinoshita et al. | |
| 2008/0284955 A1 | 11/2008 | Huitema et al. | |
| 2008/0303798 A1 | 12/2008 | Matsudate et al. | |
| 2009/0268472 A1 | 10/2009 | Kim et al. | |
| 2010/0033648 A1 | 2/2010 | Kaganezawa | |
| 2010/0066969 A1 | 3/2010 | Hwang et al. | |
| 2010/0245751 A1 | 9/2010 | Muneyoshi et al. | |

FOREIGN PATENT DOCUMENTS

| | | |
|---|---|---|
| JP | 2003-015545 | 1/2003 |
| JP | 2007-065270 | 3/2007 |
| JP | 2007-072016 | 3/2007 |
| JP | 2008-256734 | 10/2008 |
| JP | 2010-008473 | 1/2010 |

(Continued)

OTHER PUBLICATIONS

English Abstract for Publication No. 10-0912724.
English Abstract for Publication No. 10-2009-0114195.
English Abstract for Publication No. 10-2009-0114171.
English Abstract for Publication No. 10-2008-0101488.
English Abstract for Publication No. 10-0724481.

(Continued)

*Primary Examiner* — James Dudek

(57) ABSTRACT

A display panel includes a fiber reinforced plastic substrate having a first lattice pattern with a first lattice period P, and a pixel layer disposed on the substrate having a second lattice pattern having a second lattice period H, in which if H>P, P and H satisfy $$P = \frac{2H}{2n+1},$$

where n is a natural number, and if H>P, P and H satisfy $$P = \frac{(2n+1)H}{2}.$$

15 Claims, 15 Drawing Sheets

(56) References Cited

FOREIGN PATENT DOCUMENTS

| | | |
|---|---|---|
| KR | 10-2004-0050006 | 6/2004 |
| KR | 10-2004-0078329 | 9/2004 |
| KR | 10-2006-0020037 | 3/2006 |
| KR | 10-0724481 | 5/2007 |
| KR | 10-2007-0088121 | 8/2007 |
| KR | 10-2008-0101488 | 11/2008 |
| KR | 10-0912724 | 8/2009 |
| KR | 10-2009-0114171 | 11/2009 |
| KR | 10-2009-0114195 | 11/2009 |
| KR | 10-2010-0001249 | 1/2010 |
| KR | 10-2010-0034874 | 4/2010 |
| KR | 10-1051634 | 7/2011 |

OTHER PUBLICATIONS

English Abstract for Publication No. 2010-008473.
English Abstract for Publication No. 2008-256734.
English Abstract for Publication No. 2007-072016.
English Abstract for Publication No. 2003-015545.
English Abstract for Publication No. 10-2007-0088121.
English Abstract for Publication No. 10-2006-0020037.
English Abstract for Publication No. 10-2004-0078329.
English Abstract for Publication No. 10-1051634.
English Abstract for Publication No. 10-2004-0050006.
English Abstract for Publication No. 10-2010-0001249.
English Abstract for Publication No. 10-2010-0034874.
English Abstract for Publication No. 2007-065270.

* cited by examiner (a)

| Lattice period of pixel layer (H) | Lattice period of substrate (P) | | | | | | | | | | | | |
|---|---|---|---|---|---|---|---|---|---|---|---|---|---|
| 100 | | | | | 150 | 250 | 350 | 450 | 550 | 650 | 750 | 850 | 950 |
| 150 | | | | 100 | 225 | 375 | 525 | 675 | 825 | 975 | | | |
| 200 | | | | 133 | 300 | 500 | 700 | 900 | | | | | |
| 250 | | | 100 | 167 | 375 | 625 | 875 | | | | | | |
| 300 | | | 120 | 200 | 450 | 750 | | | | | | | |
| 350 | | 100 | 140 | 233 | 525 | 875 | | | | | | | |
| 400 | | 114 | 160 | 267 | 600 | 1000 | | | | | | | |
| 450 | 100 | 129 | 180 | 300 | 675 | | | | | | | | |
| 500 | 111 | 143 | 200 | 333 | 750 | | | | | | | | |
| Numerical formula | P=Hx2/9 | P=Hx2/7 | P=Hx2/5 | P=Hx2/3 | P=Hx3/2 | P=Hx5/2 | P=Hx7/2 | P=Hx9/2 | P=Hx11/2 | P=Hx13/2 | P=Hx15/2 | P=Hx17/2 | P=Hx19/2 |
| Equation | P=Hx2/(2n+1) | | | | P=Hx(2n+1)/2 | | | | | | | | |

FIG. 10

| Inch | Screen ratio | Pixel lattice period (μm) | Applicable FRP substrate standard Lattice interval of FRP substrate (μm) | | | | | | | | |
|---|---|---|---|---|---|---|---|---|---|---|---|
| 7 | | 150.00 | 100.0 | 225.0 | 375.0 | 525.0 | 675.0 | 825.0 | 975.0 | | | |
| 9.7 | 4:3 | 192.00 | 128.0 | 288.0 | 480.0 | 672.0 | 864.0 | | | | | |
| 9.7 | 4:3 | 96.00 | 144.0 | 240.0 | 336.0 | 432.0 | 528.0 | 624.0 | 720.0 | 816.0 | 912.0 | |
| 10.1 | 16:10 | 169.20 | 112.8 | 253.8 | 423.0 | 592.2 | 761.4 | 930.6 | | | | |
| 10.1 | 16:10 | 84.60 | 126.9 | 211.5 | 296.1 | 380.7 | 465.3 | 549.9 | 634.5 | 719.1 | 803.7 | 888.3 | 972.9 |
| 17 | 5:4 | 264.00 | 105.6 | 176.0 | 396.0 | 660.0 | 924.0 | | | | | |
| 19 | 5:4 | 294.00 | 117.6 | 196.0 | 441.0 | 735.0 | | | | | | |
| 23 | 16:9 | 372.00 | 106.3 | 148.8 | 248.0 | 558.0 | 930.0 | | | | | |
| 26 | 16:9 | 421.50 | 120.4 | 168.6 | 281.0 | 632.3 | | | | | | |
| 32 | 16:9 | 510.75 | 113.5 | 145.9 | 204.3 | 340.5 | 766.1 | | | | | |
| 40 | 16:9 | 648.00 | 117.8 | 144.0 | 185.1 | 259.2 | 432.0 | 972.0 | | | | |
| 40 | 16:9 | 461.50 | 102.6 | 131.9 | 184.6 | 307.7 | 692.3 | | | | | |
| 46 | 16:9 | 745.50 | 114.7 | 135.5 | 165.7 | 213.0 | 298.2 | 497.0 | | | | |
| 46 | 16:9 | 530.25 | 117.8 | 151.5 | 212.1 | 353.5 | 795.4 | | | | | |
| 55 | 16:9 | 315.00 | 126.0 | 210.0 | 472.5 | 787.5 | | | | | | |
| 57 | 16:9 | 653.50 | 100.5 | 118.8 | 145.2 | 186.7 | 261.4 | 435.7 | 980.3 | | | |
| 72 | 16:9 | 432.00 | 123.4 | 172.8 | 288.0 | 648.0 | | | | | | |
| 75 | 16:9 | 859.50 | 114.6 | 132.2 | 156.3 | 191.0 | 245.6 | 343.8 | 573.0 | | | |

DISPLAY PANEL

CROSS-REFERENCE TO RELATED APPLICATION

This application claims priority under 35 U.S.C. §119 from Korean Patent Application No. 10-2012-0053721 filed in the Korean Intellectual Property Office on May 21, 2012, the entire contents of which are herein incorporated by reference in their entirety.

BACKGROUND (a) Technical Field

The present disclosure is directed to a display panel and a display device including the same, and more particularly, to a display panel including a fiber reinforced plastic substrate and a display device including the same.

(b) Discussion of the Related Art

Display devices have grown in size as flat panel displays have come to dominate the display market. A flat panel display is a display device whose thickness is small compared with the size of a screen. Widely used flat panel displays include a liquid crystal display (LCD), an organic light emitting diode (OLED) display, etc.

A liquid crystal display generally includes an upper display panel with a common electrode, a color filter, etc., a lower display panel with a thin film transistor and a pixel electrode, and a liquid crystal layer interposed between the two display panels. When a potential difference is generated between the pixel electrode and the common electrode, an electric field is generated in the liquid crystal layer which determines an alignment direction of liquid crystal molecules. Since the transmittance of incident light depends on the alignment direction of the liquid crystal molecules, a desired image may be displayed by controlling the potential difference between the two electrodes.

An organic light emitting diode display is a self-emissive display device which includes a hole injection electrode (anode), an electron injection electrode (cathode), and an organic emission layer formed therebetween, and emits light while holes injected from the anode and electrons injected from the cathode re-couple with each other in the organic emission layer and then dissipate.

In general, a display device includes a display panel including a plurality of pixels and a plurality of display signal lines. Each pixel includes a pixel electrode connected with a display signal line through a switching element, and the display signal line may include a scanning signal line transmitting a gate signal and a data line transmitting a data signal. The scanning signal line and the data line may be insulated from each other to cross over each other. Accordingly, when a display signal line is made of an opaque conductive material such as metal, the display panel may include a lattice pattern caused by the opaque display signal lines. Further, each pixel includes a transmitting portion defined by an opening of a light blocking member, and the light blocking member may include a flat portion covering the scanning signal line and the data line. In this case, the display panel may include a lattice pattern due to the light blocking member.

In addition, since the display device uses a glass substrate which is heavy and easily damaged, there are limits to portability and display size. Accordingly, a display device has recently been developed that is light, is strong on impact, and uses a flexible plastic substrate.

In the case of a substrate that includes fiber reinforced plastic, the textured fibers used therein may form a lattice pattern. The lattice pattern of the fiber reinforced plastic substrate and the lattice pattern of the display signal lines or the light blocking member overlap each other and as a result, a moire interference pattern may occur.

SUMMARY OF THE INVENTION

Embodiments of the present disclosure provide a display panel including a substrate containing fiber reinforced plastic that can prevent a moire pattern to improve a display characteristic.

An exemplary embodiment of the present disclosure provides a display panel, including: a substrate including a first lattice pattern with a first lattice period P; and a pixel layer disposed on the substrate that includes a second lattice pattern having a second lattice period H, in which if H>P, P and H satisfy $$P = \frac{2H}{2n+1}, \qquad \text{(Equation (2))}$$

where n is a natural number, and if H>P, P and H satisfy $$P = \frac{(2n+1)H}{2}. \qquad \text{(Equation (3))}$$

The pixel layer may include a plurality of pixels arranged as a matrix, and a light blocking member that defines transmitting portions of the plurality of pixels and that forms the second lattice pattern.

The pixel layer may further include a plurality of signal lines that transmit signals to the pixels, and the light blocking member may include a portion that covers the display signal lines.

The substrate may include fiber reinforced plastic that includes a plurality of fiber bundles embedded in a resin which form the first lattice pattern.

Each fiber reinforced plastic may include at least one fiber that is one of a transparent glass fiber, a carbon fiber, an aramid fiber, or a nylon fiber, and the resin is one of a thermosetting resin, an epoxy resin, or a thermoplastic resin.

At least one of the first pattern and the second pattern may comprise a lattice pattern.

At least one of the lattice period H and the lattice period P has values in the range of ±30 µm with respect to the value determined by Equation (2) or Equation (3), and more particularly, has values in the range of ±10 µm with respect to the value determined by Equation (2) or Equation (3).

Another exemplary embodiment of the present disclosure provides a fiber reinforced plastic that includes a plurality of fiber bundles that form a first lattice pattern having a first period P; and a pixel layer comprises a plurality of pixels arranged as a matrix having a second period H, in which if H>P, P and H satisfy $$P = \frac{2H}{2n+1}, \qquad \text{(Equation (2))}$$

where n is a natural number, and if H<P, P and H satisfy $$P = \frac{(2n+1)H}{2}. \qquad \text{(Equation (3))}$$

The fiber reinforced plastic may form a substrate, the pixel layer may be disposed on the substrate, and the pixel matrix may form a second lattice pattern.

According to an exemplary embodiment of the present disclosure, it is possible to prevent a display defect due to a moire pattern in a display panel that includes a substrate containing fiber reinforced plastic to improve a display characteristic.

BRIEF DESCRIPTION OF THE DRAWINGS

FIG. 9 is a table based on data from FIGS. 8A to 8I, that illustrates substrate lattice period values for each pixel lattice period value that are associated with minimum values of the moiré pattern generation periods.

FIG. 10 is a table illustrating lattice periods of fiber reinforced plastic substrates which may be applied to display devices of various sizes.

DETAILED DESCRIPTION OF EXEMPLARY EMBODIMENTS

Figure 1:
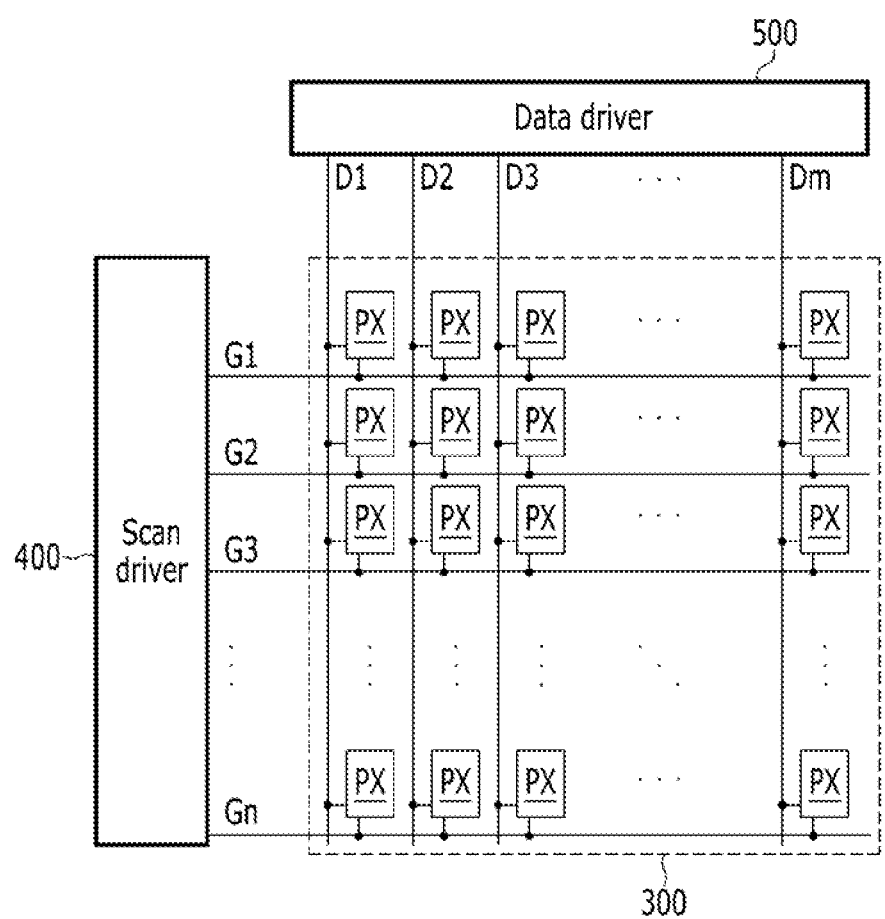
FIG. 1 is a block diagram of a display device according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, like reference numerals designate like elements throughout the specification. It will be understood that when an element such as a layer, film, region, or substrate is referred to as being "on" another element, it can be directly on the other element or intervening elements may also be present.

First, a display panel and a display device including the same according to an exemplary embodiment of the present disclosure will be described with reference to FIGS. 1 to 3.

Figure 2:
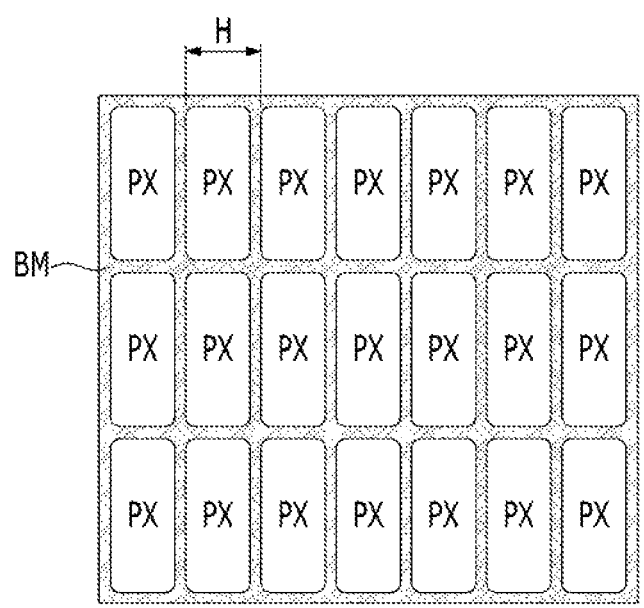
FIG. 2 is a layout view of a plurality of pixels of the display device according to an exemplary embodiment of the present disclosure.
Figure 3:
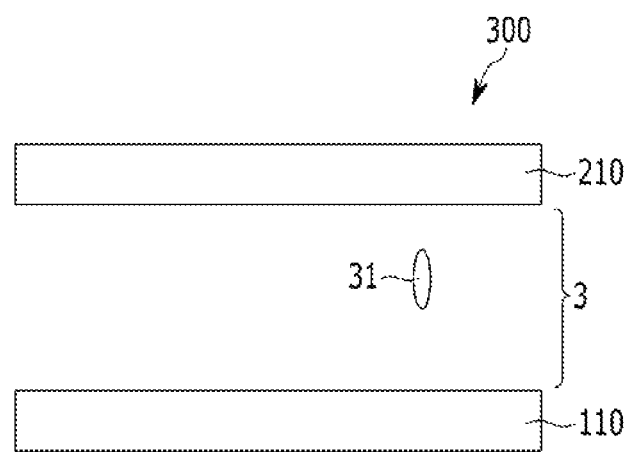
FIG. 3 is a cross-sectional view of the display device according to an exemplary embodiment of the present disclosure.
Figure 3:
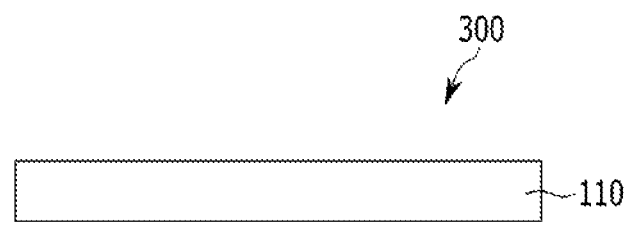

FIG. 1 is a block diagram of a display device according to an exemplary embodiment of the present disclosure, FIG. 2 is a layout view of a plurality of pixels of the display device according to the exemplary embodiment of the present disclosure, and FIG. 3 is a brief cross-sectional view of the display device according to the exemplary embodiment of the present disclosure.

Referring to FIG. 1, the display device according to the exemplary embodiment of the present disclosure includes a display panel 300, a scan driver 400, and a data driver 500.

The display panel 300 includes a plurality of signal lines G1-Gn and D1-Dm and a plurality of pixels PX connected thereto and arranged as a matrix.

The signal lines G1-Gn and D1-Dm may include a plurality of scanning lines G1-Gn transmitting scanning signals and a plurality of data lines D1-Dm transmitting data voltages. The scanning lines G1-Gn may extend in a substantially horizontal direction and be substantially parallel to each other, and the data lines D1-Dm may extend in a substantially vertical direction and be substantially parallel to each other. The plurality of scanning lines G1-Gn and the plurality of data lines D1-Dm cross each other to form a lattice pattern, hereinafter referred to as a 'lattice', as shown in FIG. 1. Herein, the lattice pattern or lattice may mean a dark pattern of straight lines having a regular period in one direction, or may also mean a dark pattern of straight lines having a regular period in two crossing directions, respectively.

The signal lines G1-Gn and D1-Dm may be made of an opaque conductive material such as a metal, including aluminum (Al), copper (Cu), etc., or a transparent conductive material. If the signal lines G1-Gn and D1-Dm include the opaque conductive materials, the lattice of signal lines G1-Gn and D1-Dm may be visible.

If the plurality of scanning lines G1-Gn and the plurality of data lines D1-Dm are disposed at regular intervals, the lattice of signal lines G1-Gn and D1-Dm may have a regular period. Herein, the lattice period means a distance between two adjacent straight lines forming the lattice.

A horizontal period of the lattice of signal lines G1-Gn and D1-Dm may be determined by a distance between adjacent data lines D1-Dm, and a vertical period may be determined by a distance between adjacent scanning lines G1-Gn.

A pixel PX for displaying an image includes a switching element (not shown) such as a thin film transistor, a pixel electrode (not shown) connected with the switching element, an electro-optical conversion element (not shown) converting an electric signal to light, etc. A pixel PX may receive a data voltage from the data lines D1-Dm through the switching element (not shown) which is turned on depending on a scanning signal from the scanning lines G1-Gn and display an image through the electro-optical conversion element (not shown). The electro-optical conversion element (not shown) may include a liquid crystal layer in the case of a liquid crystal display, and an organic light emitting member in the case of an organic light emitting diode display.

The display panel 300 of a display device according to an exemplary embodiment of the present disclosure may further include a light blocking member BM capable of blocking light leakage between the pixels PX. The light blocking member BM may include straight portions covering the scanning lines G1-Gn and the data lines D1-Dm.

Referring to FIG. 2, the pixel PX may include transmitting portions defined as openings between the light blocking member BM, and the transmitting portions of the pixel PX may be arranged as a matrix with regular intervals. A horizontal period of the lattice of light blocking member BM may be a horizontal distance between the centers of the transmitting portions of two adjacent pixels PX, and a vertical period of the lattice of light blocking member BM may be a vertical distance between the centers of the transmitting portions of two adjacent pixels PX. Herein, the horizontal interval between the centers of the transmitting portions of the two adjacent pixels PX is called the period H of the transmitting portion of the pixel PX.

The period of the lattice of light blocking member BM may be the same as the period H of the transmitting portion of the pixel PX.

In an exemplary embodiment of the present disclosure, if the signal lines G1-Gn and D1-Dm are opaque and covered by the light blocking member BM, the period of the lattice of signal lines G1-Gn and D1-Dm, that is, the distance between adjacent signal lines G1-Gn and D1-Dm may be larger than the period of the lattice of light blocking member BM or the period of the transmitting portion of the pixel PX, and more particularly may be a multiple of the period of the transmitting portion of the pixel PX. For example, in an exemplary embodiment shown in FIG. 1, the period of the transmitting portion of the pixel PX is the same as the period of the lattice by the signal lines G1-Gn and D1-Dm.

Referring back to FIG. 1, the scan driver 400 is connected to the scanning lines G1-Gn of the display panel 300 and applies scanning signals comprising a high voltage Von and a low voltage Voff to the scanning lines G1-Gn.

The data driver 500 is connected to the data lines D1-Dm of the display panel 300 and applies data voltages representing an image signal to the data lines D1-Dm.

Referring to FIG. 3A, the display panel 300 of the display device according to the exemplary embodiment of the present disclosure may include a lower substrate 110 and an upper substrate 210 facing each other, and an electro-optical conversion layer 3 such as a liquid crystal layer disposed between the two substrates 110 and 210. In the case of the liquid crystal display, the electro-optical conversion layer 3 may include a liquid crystal layer including liquid crystal molecules 31.

A plurality of thin film layers forming the plurality of signal lines G1-Gn and D1-Dm, the pixels PX, and the light blocking member BM as described above may be formed on the lower substrate 110 or the upper substrate 210, and are referred to as a pixel layer.

Referring to FIG. 3B, a display panel 300 of a display device according to another exemplary embodiment of the present disclosure may include a lower substrate 110 and a pixel layer formed thereon. In the case of the organic light emitting diode display, the pixel layer may include a switching element such as a thin film transistor, a pixel electrode, and a plurality of layers such as an organic emission layer.

As described above, the pixel layer may include a lattice pattern formed where light is not transmitted by the light blocking member BM or the signal lines G1-Gn and D1-Dm. Further, the lattice period H of the pixel layer may be the lattice period H by the light blocking member BM or the period H of the transmitting portion of the pixel PX described above.

Each of the lower substrate 110 and upper substrate 210 according to an exemplary embodiment of the present disclosure may have a lattice pattern having a regular lattice period. For example, each of the lower substrate 110 and upper substrate 210 may be made of a fiber reinforced plastic (FRP) and may have a lattice pattern due to fibers included in the fiber reinforced plastic. This will be described with reference to FIGS. 4 and 5.

Figure 4:
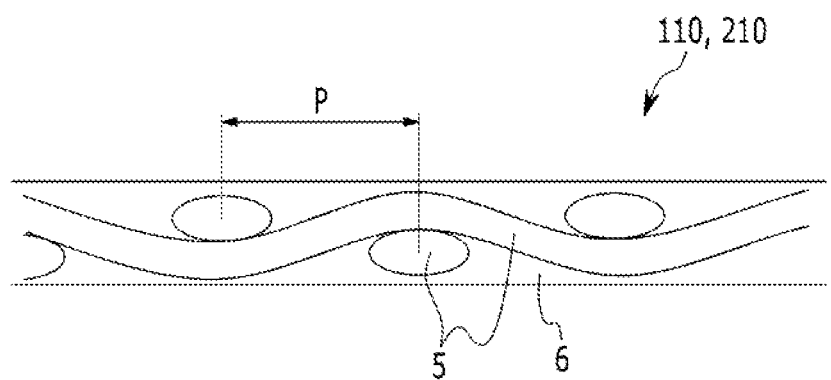
FIG. 4 is a cross-sectional view of fiber reinforced plastic contained in the substrate of a display device according to an exemplary embodiment of the present disclosure.
Figure 5:
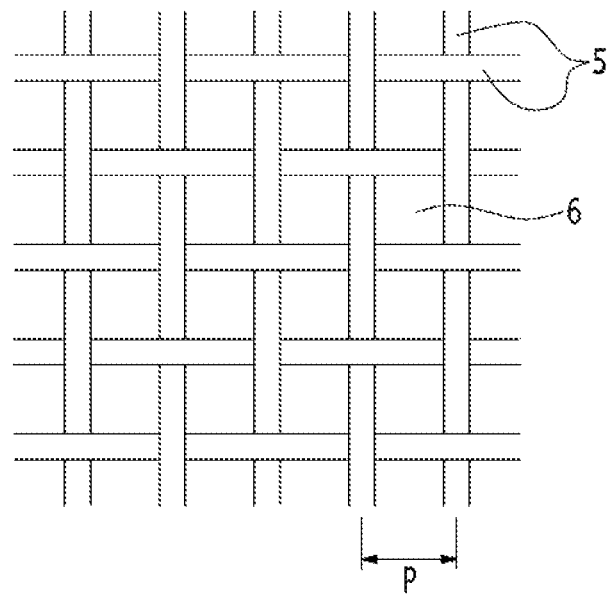
FIG. 5 is a plan view of the fiber reinforced plastic contained in the substrate of a display device according to an exemplary embodiment of the present disclosure.

FIG. 4 is a cross-sectional view of fiber reinforced plastic contained in the substrate of a display device according to an exemplary embodiment of the present disclosure, and FIG. 5 is a plan view of the fiber reinforced plastic contained in the substrate of a display device according to an exemplary embodiment of the present disclosure.

Referring to FIGS. 4 and 5, a fiber reinforced plastic according to an exemplary embodiment of the present disclosure may include a plurality of fiber bundles 5 extending in two directions substantially perpendicular to each other and embedded in a resin 6. The fiber bundles 5 may include at least one fiber. The fiber bundles 5 may include a transparent glass fiber, a carbon fiber, an aramid fiber, or a nylon fiber. The resin 6 may include a thermosetting resin such as polyester, an epoxy resin or a thermoplastic resin.

The textured fiber bundles 5 may be disposed in a horizontal direction or a vertical direction at regular intervals and may form lattice patterns in the substrates 110 and 210. The regular interval of two adjacent fiber bundles 5 extending substantially in the same direction may be called the lattice period P of the substrates 110 and 210.

Alternatively, unlike those shown in FIGS. 4 and 5, the fiber bundles 5 of the substrates 110 and 210 may also extend in one direction.

As described above, since the substrates 110 and 210 and the pixel layer formed thereon included in a display panel 300 according to an exemplary embodiment of the present disclosure include the respective lattices, the lattice of the substrates 110 and 210 and the lattice of the pixel layer may overlap each other. If the lattice period H of the pixel layer and the lattice period P of the substrates 110 and 210 equal each other or are not multiples/divisors of each other, an interference fringe such as a moire pattern may be generated. This will be described with reference to FIGS. 6A to 6E and 7.

Figure 6A:
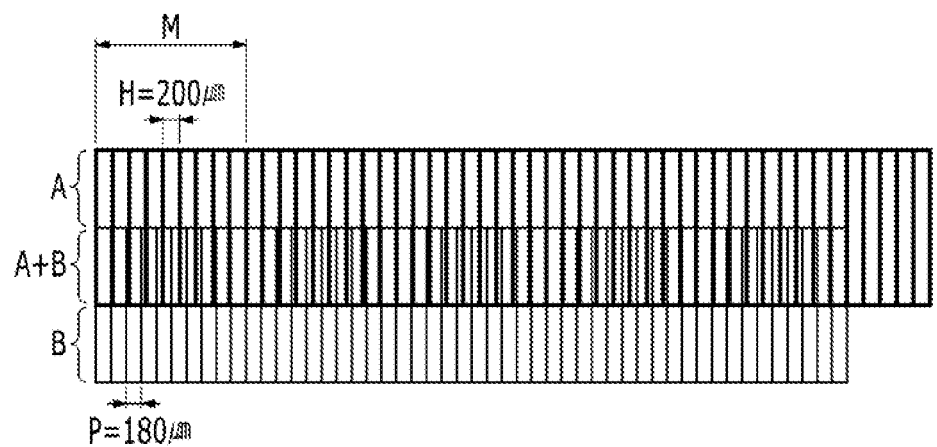
FIGS. 6A to 6E illustrate moire patterns that occur when a lattice period of a pixel layer changes with respect to the lattice period of the substrate, according to an exemplary embodiment of the present disclosure, respectively.
Figure 6B:
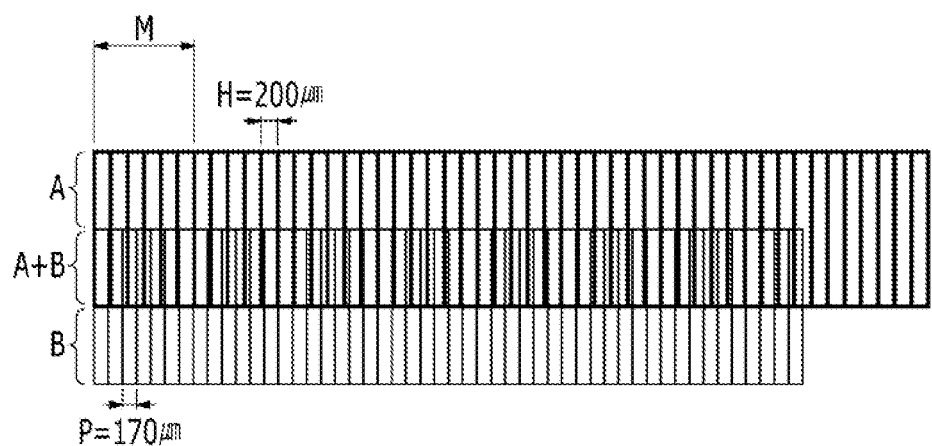
Figure 6C:
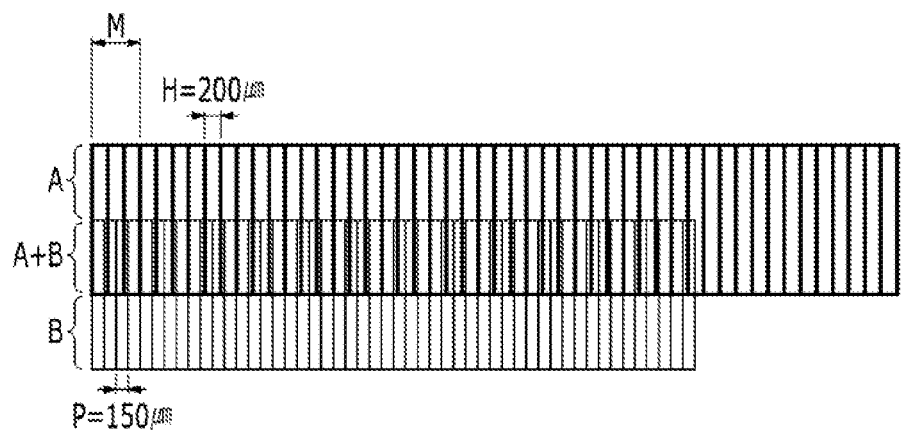
Figure 6D:
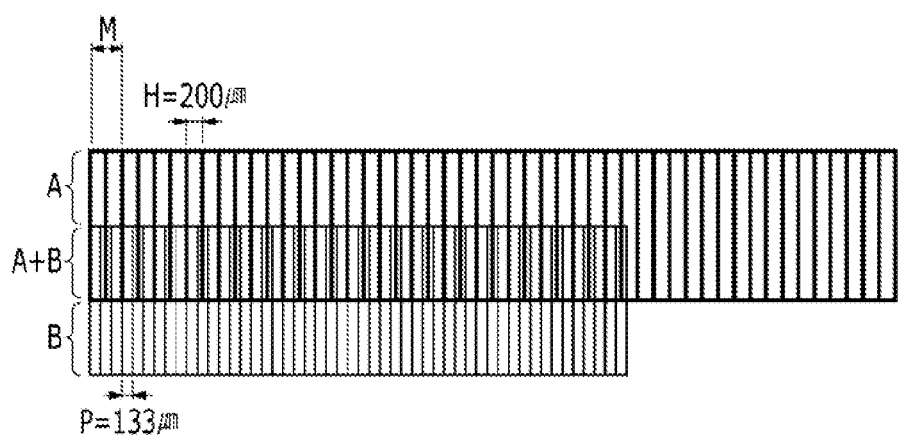
Figure 6E:
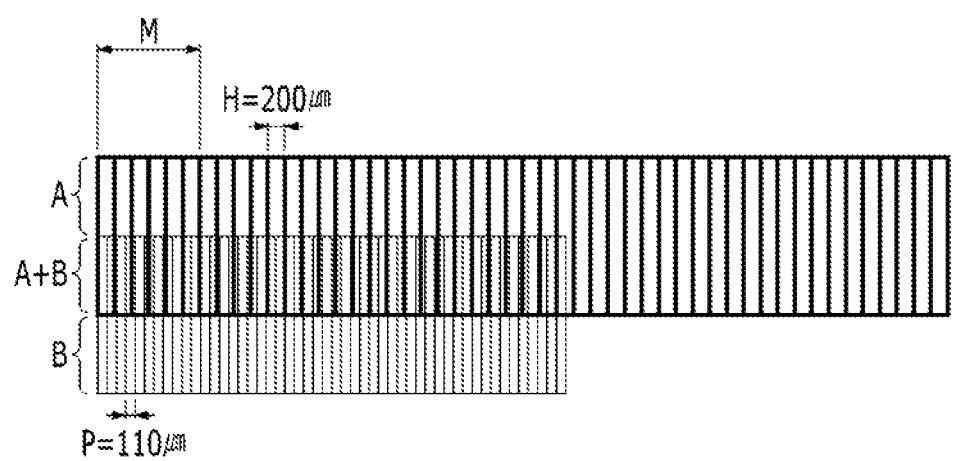
Figure 7:
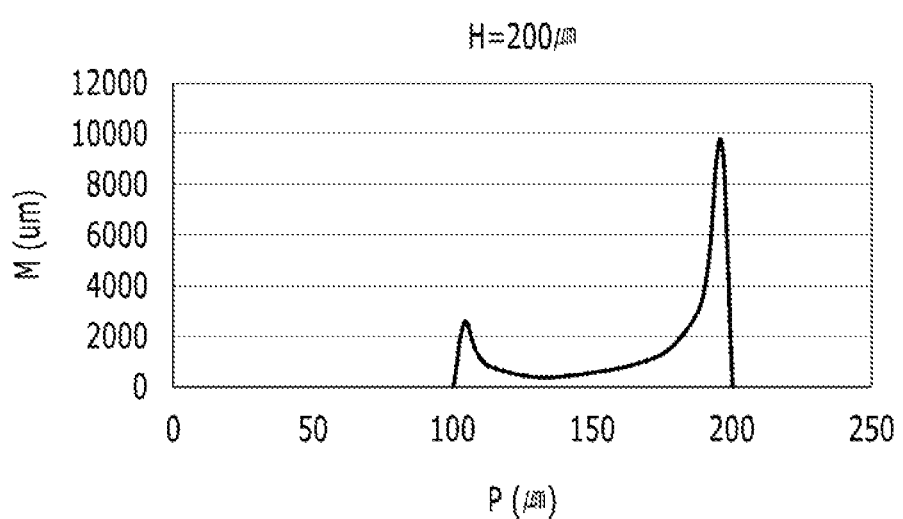
FIG. 7 is a graph illustrating the generation periods of moire patterns resulting from a change in the substrate lattice period, according to an exemplary embodiment of the present disclosure.
Figure 8A:
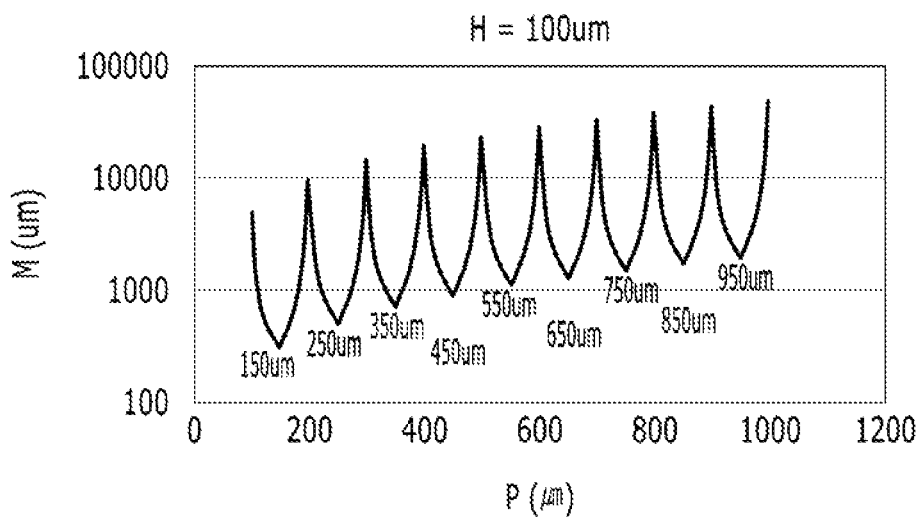
FIGS. 8A to 8I are graphs illustrating generation periods of moire patterns resulting from changes in the substrate lattice period for different values of the pixel layer lattice period.
Figure 8B:
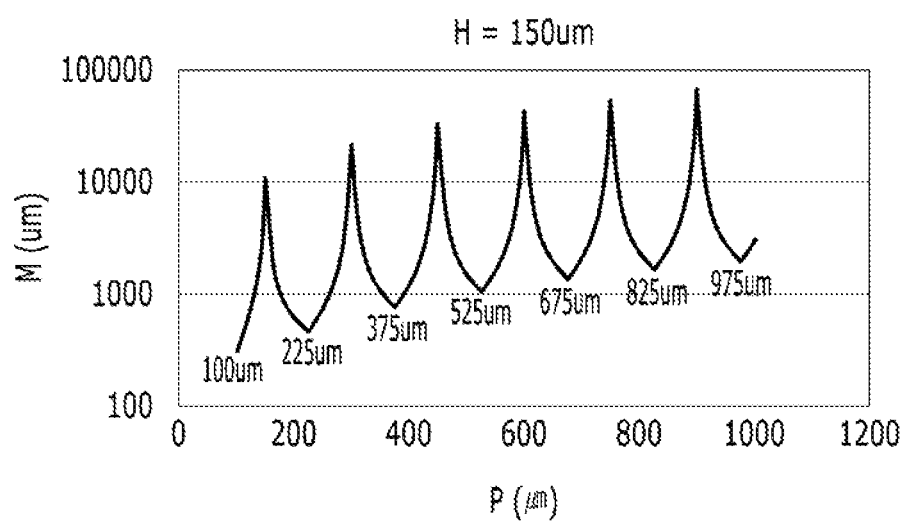
Figure 8C:
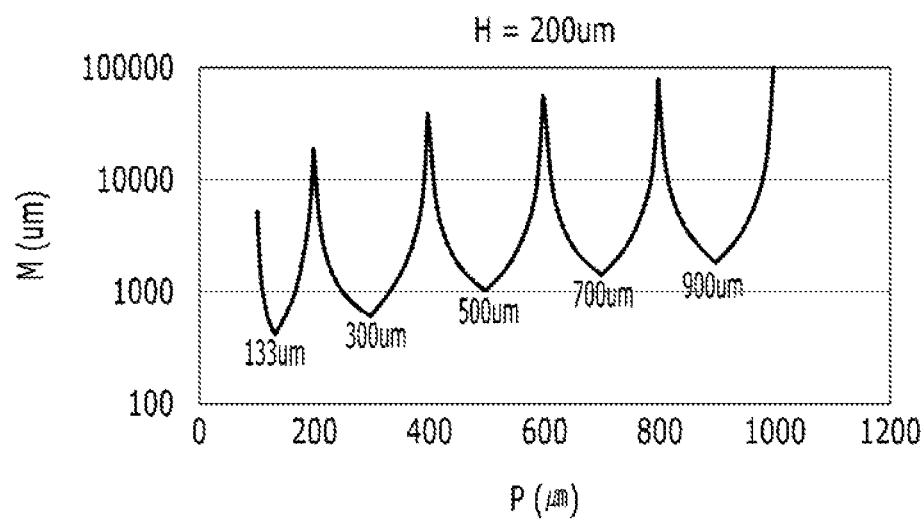
Figure 8D:
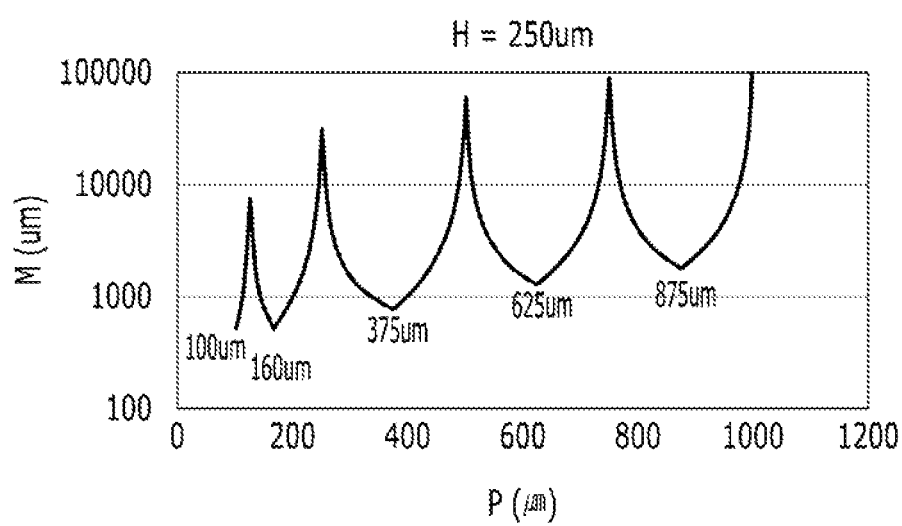
Figure 8E:
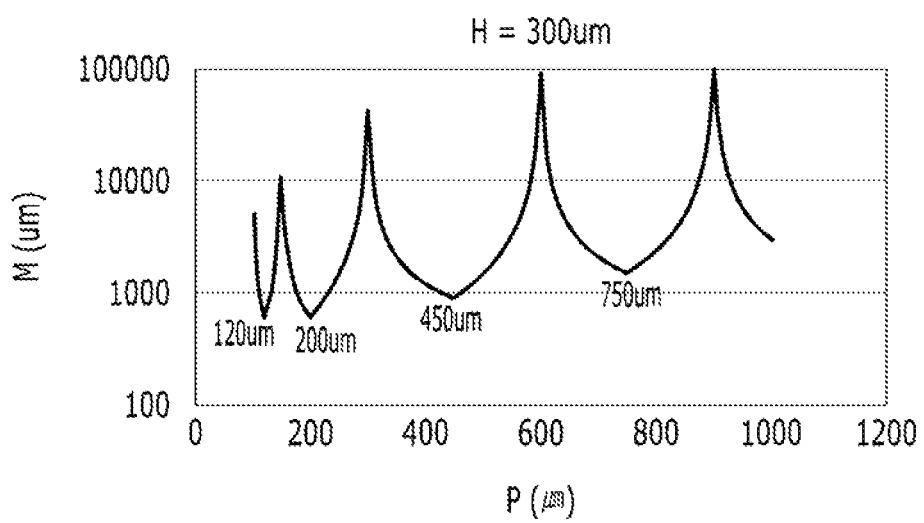
Figure 8F:
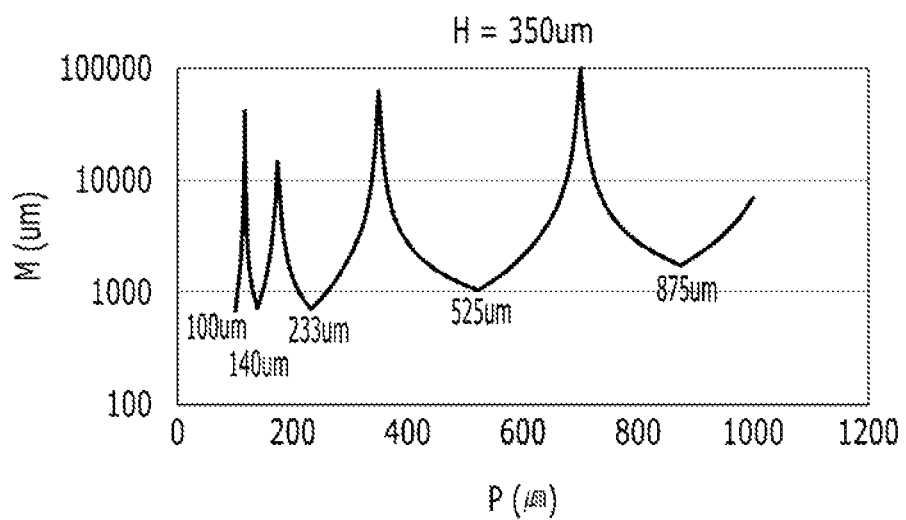
Figure 8G:
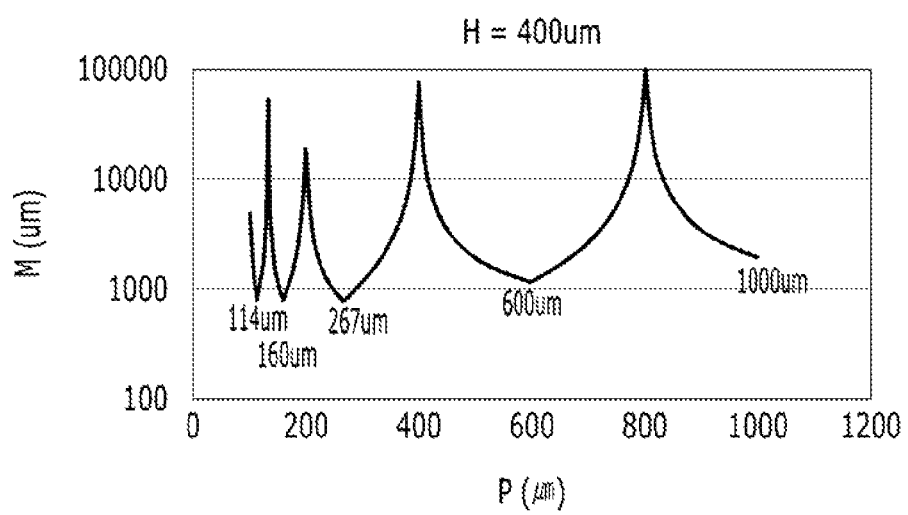
Figure 8H:
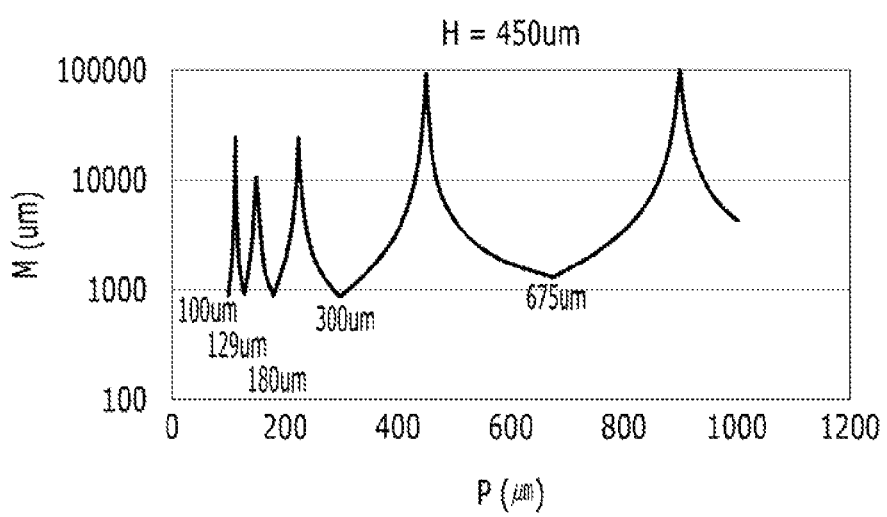
Figure 8I:
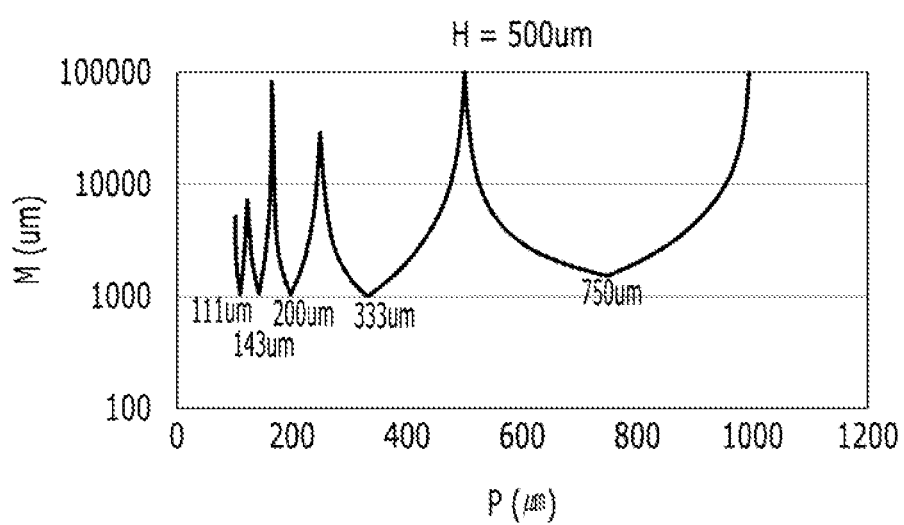

FIGS. 6A to 6E illustrate moire patterns that occur when a lattice period of a pixel layer changes with respect to a lattice period of the substrate, according to an exemplary embodiment of the present disclosure, respectively, and FIG. 7 is a graph illustrating the generation period of moire patterns resulting from a change in the substrate lattice period, according to an exemplary embodiment of the present disclosure.

First, referring to FIG. 6A, when a pixel layer A includes a lattice pattern having a lattice period H, and a substrate B includes a lattice pattern having a lattice period P, moire patterns having a regular period may occur when the pixel layer A and the substrate B overlap each other. Herein, the substrate B may be the lower substrate 110 or the upper substrate 210 of the display device described above, and the pixel layer A may represent the pixel layer formed on the substrates 110 and 210 as described above. The moire patterns of the display panel 300 cause vertical or horizontal spot defects, thereby deteriorating display quality. Accordingly, to improve display quality of the display device, the moire patterns should be reduced to reduce or eliminate the spots or lines resulting from the moire patterns.

When the lattice period of at least one of the pixel layer A and the substrate B changes, a generation period of the moire pattern changes. FIGS. 6A to 6E illustrate moire patterns that occur when the lattice period P of the substrate B changes with respect to the lattice period H of the pixel layer A, where M denotes the generation periods of the moire patterns.

In more detail, FIGS. 6A to 6E and 7 illustrate moire patterns with generation periods M that occur when the lattice period P of the substrate B changes step by step from, for example, 200 μm to 96 μm, with respect to the lattice period H of the pixel layer A, for example, 200 μm. FIGS. 6A to 6E respectively show that moire patterns are generated only when the lattice periods P of the substrate B are about 180 μm, 170 μm, 150 μm, 133 μm, and 110 μm, and thus do not include the entire range of lattice periods of the substrate B shown in FIG. 7.

Referring to FIGS. 6A to 6E, it may be verified that when the lattice period P of the substrate B is about 180 μm, the generation period M of the moire pattern is about 1,800 μm, and when the lattice period P of the substrate B is about 170 μm, the generation period M of the moire pattern is about 1,200 μm. In addition, it may be verified that when the lattice period P of the substrate B is about 150 μm, the generation period M of the moire pattern is about 600 μm, when the lattice period P of the substrate B is about 133 μm, the generation period M of the moire pattern is about 400 μm, and when the lattice period P of the substrate B is about 110 μm, the generation period M of the moire pattern is about 1,200 μm.

Referring to FIG. 7, it can be seen that in the case where the lattice period H of the pixel layer A is regular, for example, about 200 μm, when the lattice period P of the substrate B increases from about 100 μm to about 200 μm, the generation period M of the moire pattern starts from 0, rapidly increases and then decreases to a minimum value when the lattice period P of the substrate B is approximately 133 μm, and thereafter, rapidly increases again and then falling to 0 when the lattice period P of the substrate B becomes a multiple/divisor of the lattice period H of the pixel layer A.

The generation forms of the moire patterns may be verified in FIGS. 6A to 6E. As shown in FIG. 6A, when the generation period M of the moire pattern is relatively large, the moire pattern is easy to be recognized as an irregular pattern of vertical or horizontal lines in the display device. However, as shown in FIG. 6D, when the generation period M of the moire pattern is a minimum, the moire pattern appears as a regular line pattern and may not be recognized by an observer. Accordingly, in a display device including the substrate B containing the fiber reinforced plastic and the pixel layer A, to minimize or obscure the irregular patterns due to a moire effect, the generation period M of the moire pattern may be minimized.

Then, a method of minimizing a generation period of a moire pattern in a display device according to an exemplary embodiment of the present disclosure and a display device using the method will be described with reference to FIGS. 8A to 8I, 9, and 10.

FIGS. 8A to 8I are graphs illustrating generation periods of moire patterns resulting from changes in the substrate lattice period for different values of the pixel layer lattice period, FIG. 9 is a table based on data from FIGS. 8A to 8I, that illustrates substrate lattice period values for each pixel lattice period value that are associated with minimum values of the moiré pattern generation periods, and FIG. 10 is a table illustrating lattice periods of fiber reinforced plastic substrates which may be applied to display devices of various sizes.

First, as a result of verifying changes of the moire pattern generation period that result from changing the lattice periods of the pixel layer A and the substrate B, it can be seen that the generation period M of the moire pattern may be calculated by the following Equation (1).

$$M = \frac{1}{n/H - m/P} \quad \text{Equation (1)}$$

In Equation (1), H represents a lattice period of a pixel layer A, that is, a period of a lattice of light blocking member BM or a period of the transmitting portion of a pixel PX, P represents a lattice period of the substrates B 110 and 210, n represents a natural number derived from rounding H/P, and m represents a natural number derived from rounding P/H.

FIGS. 8A to 8I are graphs illustrating generation periods M of moire patterns calculated from Equation 1 as an example, in which the lattice periods H of the pixel layer A change from 100 μm to 500 μm by 50 μm for each graph, and the lattice periods P of the substrate B change from 100 μm to 1,000 μm by 1 μm in the abscissa of each graph, respectively. As may be verified in FIGS. 8A to 8I, values of lattice period P associated with minimum values of the moire pattern generation periods M 1 are periodic.

FIG. 9 is a table based on data from FIGS. 8A to 8I, that illustrates substrate lattice period values for each pixel lattice period value that are associated with minimum values of the moiré pattern generation periods.

In a result shown in FIG. 9, it may be found that points associated with minimum values of the moire pattern generation periods have a specific regularity, and that regularity may be expressed in the following Equation (2) and Equation (3).

$$\text{If } H > P, \text{ then } P = \frac{2H}{2n+1} \ (n \text{ is a natural number}) \quad \text{Equation (2)}$$

$$\text{If } H < P, \text{ then } P = \frac{(2n+1)H}{2} \ (n \text{ is a natural number}) \quad \text{Equation (3)}$$

Accordingly, in a display device according to an exemplary embodiment of the present disclosure, to prevent a display defect such as a vertical or horizontal line resulting from a moire pattern, the lattice periods H and P of the pixel layer A and the substrate B may be determined based on Equation (2) and Equation (3). That is, if the lattice period H of the light blocking member BM that defines the transmitting portion of the pixel PX or the period H of the transmitting portion of the pixel PX is greater than the lattice pattern P of the fiber of the substrate B, either the pixel layer is formed or the substrate B is selected to satisfy Equation (2), and if the period H of the transmitting portion of the pixel PX is less than the lattice pattern P of the fiber of the substrates 110 and 210, either the pixel layer is formed or the substrate B is selected to satisfy Equation (3). In both cases, at least one of the lattice period H of the pixel layer A and the lattice period P of the substrate B may have values in the range of ±30 μm, more particularly, in the range of ±10 μm with respect to the value determined by Equation (2) or Equation (3), and even then, it is possible to substantially prevent a display defect due to the moire pattern from being recognized.

FIG. 10 is a table illustrating standards of fiber reinforced plastic substrates which may be applied to prevent a display defect based on a size of the display device to be manufactured. For example, in the case where a screen size of the display device is 9.7 inch and a pixel size, that is, the lattice period H of the pixel layer A is about 192 μm, lattice periods of a usable fiber reinforced plastic substrate may be 128 μm±10 μm, 288 μm±10 μm, 480 μm±10 μm, 672 μm±10 μm, 864 μm±10 μm, etc.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A display panel, comprising:
   a substrate that includes a plurality of fiber bundles that form a first pattern having a first period P; and
   a pixel layer disposed on the substrate and that includes a second pattern having a second period H,
   wherein
   if H>P, P and H satisfy $$P = \frac{2H}{2n+1}, \quad \text{(Equation (2))}$$

wherein n is a natural number, and if H<P, P and H satisfy $$P = \frac{(2n+1)H}{2}. \quad \text{(Equation (3))}$$

2. The display panel of claim 1, wherein:
   the pixel layer comprises a plurality of pixels arranged as a matrix, and a light blocking member that defines transmitting portions of the plurality of pixels and forms the second pattern.
3. The display panel of claim 2, wherein:
   the pixel layer further includes a plurality of signal lines that transmit signals to the pixels, and
   the light blocking member includes a portion that cover the signal lines.
4. The display panel of claim 1, wherein:
   the substrate includes a fiber reinforced plastic that includes the plurality of fiber bundles embedded in a resin.
5. The display panel of claim 4, wherein:
   each fiber bundle includes at least one fiber that is one of a transparent glass fiber, a carbon fiber, an aramid fiber, or a nylon fiber, and the resin is one of a thermosetting resin, an epoxy resin, or a thermoplastic resin.
6. The display panel of claim 1, wherein at least one of the first pattern and the second pattern comprises a lattice pattern.
7. The display panel of claim 1 wherein at least one of the lattice period H and the lattice period P has values in the range of ±30 μm with respect to the value determined by Equation (2) or Equation (3).
8. The display panel of claim 7 wherein at least one of the lattice period H and the lattice period P has values in the range of ±10 μm with respect to the value determined by Equation (2) or Equation (3).

9. A display panel, comprising:
   a fiber reinforced plastic that includes a plurality of fiber bundles that form a first lattice pattern having a first period P; and
   a pixel layer comprising a plurality of pixels arranged as a matrix having a second period H,
   wherein if H>P, P and H satisfy $$P = \frac{2H}{2n+1}, \quad \text{(Equation (2))}$$

wherein n is a natural number, and if H<P, P and H satisfy $$P = \frac{(2n+1)H}{2}. \quad \text{(Equation (3))}$$

10. The display panel of claim 9, wherein the fiber reinforced plastic forms a substrate, the pixel layer is disposed on the substrate, and the pixel matrix forms a second lattice pattern.
11. The display panel of claim 9, wherein the pixel layer comprises:
    a plurality of signal lines that transmit signals to the pixels; and
    a light blocking member that defines transmitting portions of the plurality of pixels, wherein the light blocking member includes a portion that cover the signal lines.
12. The display panel of claim 9, wherein the plurality of fiber bundles are embedded in a resin, and each fiber bundle includes at least one fiber.
13. The display panel of claim 12, wherein the at least one fiber is one of a transparent glass fiber, a carbon fiber, an aramid fiber, or a nylon fiber and the resin is one of a thermosetting resin, an epoxy resin, or a thermoplastic resin.
14. The display panel of claim 9, wherein at least one of the lattice period H and the lattice period P has values in the range of ±30 μm with respect to the value determined by Equation (2) or Equation (3).
15. The display panel of claim 14, wherein at least one of the lattice period H and the lattice period P has values in the range of ±10 μm with respect to the value determined by Equation (2) or Equation (3).

* * * * *